(12) United States Patent
Lee et al.

(10) Patent No.: US 9,812,259 B2
(45) Date of Patent: Nov. 7, 2017

(54) MULTILAYER CERAMIC CAPACITOR, METHOD OF MANUFACTURING THE SAME, AND BOARD HAVING THE SAME

(71) Applicant: SAMSUNG ELECTRO-MECHANICS CO., LTD., Suwon-Si, Gyeonggi-Do (KR)

(72) Inventors: Seung Ho Lee, Suwon-Si (KR); Jong Han Kim, Suwon-Si (KR); Min Gon Lee, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 197 days.

(21) Appl. No.: 14/516,435

(22) Filed: Oct. 16, 2014

(65) Prior Publication Data

US 2015/0348712 A1 Dec. 3, 2015

(30) Foreign Application Priority Data

May 28, 2014 (KR) .................. 10-2014-0064329

(51) Int. Cl.
| | |
|---|---|
| *H01G 4/30* | (2006.01) |
| *H01G 4/12* | (2006.01) |
| *H01G 4/248* | (2006.01) |
| *H01G 2/06* | (2006.01) |
| *H05K 3/34* | (2006.01) |

(52) U.S. Cl.
CPC ............ *H01G 4/30* (2013.01); *H01G 4/1227* (2013.01); *H01G 4/248* (2013.01); *H01G 2/06* (2013.01); *H05K 3/3442* (2013.01); *H05K 2201/10015* (2013.01)

(58) Field of Classification Search
CPC ........ H01G 4/30; H01G 4/248; H01G 4/1227; H01G 2/06; H05K 2201/10015; H05K 3/3442

See application file for complete search history.

(56) References Cited

U.S. PATENT DOCUMENTS

| | | | | |
|---|---|---|---|---|
| 6,229,686 | B1 * | 5/2001 | Shimahara | H01G 4/30 361/311 |
| 6,839,221 | B2 * | 1/2005 | Sugimoto | H01G 4/30 361/301.4 |
| 8,947,851 | B2 * | 2/2015 | Koizumi | H01G 4/1209 361/301.4 |
| 2004/0066605 | A1 * | 4/2004 | Trinh | H01G 4/2325 361/321.2 |

(Continued)

FOREIGN PATENT DOCUMENTS

| | | | |
|---|---|---|---|
| JP | 02086109 A | * | 3/1990 |
| JP | 08-222470 A | | 8/1996 |

(Continued)

*Primary Examiner* — David M Sinclair
(74) *Attorney, Agent, or Firm* — McDermott Will & Emery LLP

(57) ABSTRACT

A multilayer ceramic capacitor may include: an active part including dielectric layers and internal electrodes which are alternately stacked therein; and a cover part disposed on at least one of an upper surface and a lower surface of the active part. The cover part may include an active part protective cover and an exterior cover, and the active part protective cover may be disposed adjacent to the active part.

22 Claims, 16 Drawing Sheets

A - A'

(56) References Cited

U.S. PATENT DOCUMENTS

| | | | |
|---|---|---|---|
| 2006/0158827 A1* | 7/2006 | Lee | H01G 4/30 361/311 |
| 2008/0013252 A1* | 1/2008 | Nakano | H01G 4/06 361/311 |
| 2009/0042048 A1* | 2/2009 | Iguchi | C04B 37/006 428/542.8 |
| 2009/0207554 A1* | 8/2009 | Iguchi | H01G 2/24 361/321.2 |
| 2011/0056735 A1 | 3/2011 | Lee et al. | |
| 2011/0141660 A1 | 6/2011 | Jeong et al. | |
| 2012/0218678 A1* | 8/2012 | Satou | H01G 4/12 361/303 |
| 2012/0300361 A1* | 11/2012 | Togashi | H01G 4/30 361/301.4 |
| 2013/0094121 A1* | 4/2013 | Endo | H01G 4/30 361/305 |
| 2013/0208399 A1* | 8/2013 | Morita | H01G 4/30 361/301.4 |
| 2014/0022692 A1* | 1/2014 | Yoon | H01G 4/12 361/301.4 |
| 2014/0301012 A1* | 10/2014 | Kim | H01G 4/30 361/301.4 |
| 2015/0016015 A1* | 1/2015 | Lee | H01G 4/30 361/301.4 |
| 2016/0196918 A1* | 7/2016 | Hong | H01G 4/12 174/260 |

FOREIGN PATENT DOCUMENTS

| | | | |
|---|---|---|---|
| JP | 2003309039 A | * | 10/2003 |
| JP | 2005159056 A | * | 6/2005 |
| JP | 2006278557 A | * | 10/2006 |
| JP | 2007149990 A | * | 6/2007 |
| JP | 2007266223 A | * | 10/2007 |
| KR | 10-2011-0065625 A | | 6/2011 |
| KR | 10-1069989 B1 | | 9/2011 |

* cited by examiner

B - B'

MULTILAYER CERAMIC CAPACITOR, METHOD OF MANUFACTURING THE SAME, AND BOARD HAVING THE SAME

CROSS-REFERENCE TO RELATED APPLICATION

This application claims the benefit of Korean Patent Application No. 10-2014-0064329 filed on May 28, 2014 with the Korean Intellectual Property Office, the disclosure of which is incorporated herein by reference.

BACKGROUND

The present disclosure relates to a multilayer ceramic capacitor, a method of manufacturing the same, and a board having the same.

A multilayer ceramic capacitor commonly includes a ceramic body formed of a ceramic material, internal electrodes formed in the ceramic body, and external electrodes installed on at least one surface of the ceramic body so as to be connected to the internal electrodes.

Multilayer ceramic capacitors having high degrees of reliability are in demand for devices requiring high degrees of reliability, as many functions are digitalized in the devices.

However, the occurrence of cracks and delamination in addition to poor withstand voltage characteristics inhibit achieving high degrees of reliability in the multilayer ceramic capacitors, while residual carbon present in the ceramic bodies of multilayer ceramic capacitors may also have a negative influence on the reliability thereof. Accordingly, there is a need to decrease an amount of residual carbon within ceramic bodies in order to improve the reliability of multilayer ceramic capacitors.

SUMMARY

Embodiments of the present disclosure may provide a multilayer ceramic capacitor, a method of manufacturing the same, and a board having the same.

According to an exemplary embodiment of the present disclosure, a multilayer ceramic capacitor may include: an active part including dielectric layers and internal electrodes which are alternately stacked therein; and a cover part disposed on at least one of an upper surface and a lower surface of the active part, wherein the cover part may include an active part protective cover and an exterior cover, the active part protective cover being disposed adjacent to the active part.

A removal rate of residual carbon in the exterior cover may be faster than a removal rate of residual carbon in the active part protective cover.

According to another exemplary embodiment of the present disclosure, a method of manufacturing a multilayer ceramic capacitor may include: preparing a first multilayer body by stacking first green sheets on which internal electrode patterns are formed; preparing second green sheets for forming an active part protective cover, separately from the preparing of the first multilayer body; preparing third green sheets for forming an exterior cover, separately from the preparing of the first multilayer body and the preparing of the second green sheets; preparing a multilayer body for a cover part by stacking the second green sheets and the third green sheets; preparing a green sheet multilayer body by disposing the multilayer body for a cover part on at least one of an upper surface and a lower surface of the first multilayer body; and sintering the green sheet multilayer body.

According to another exemplary embodiment of the present disclosure, a board having a multilayer ceramic capacitor may include: a printed circuit board on which a plurality of electrode pads are disposed; the multilayer ceramic capacitor as described above mounted on the printed circuit board, and solders connecting the plurality of electrode pads and the multilayer ceramic capacitor to each other.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
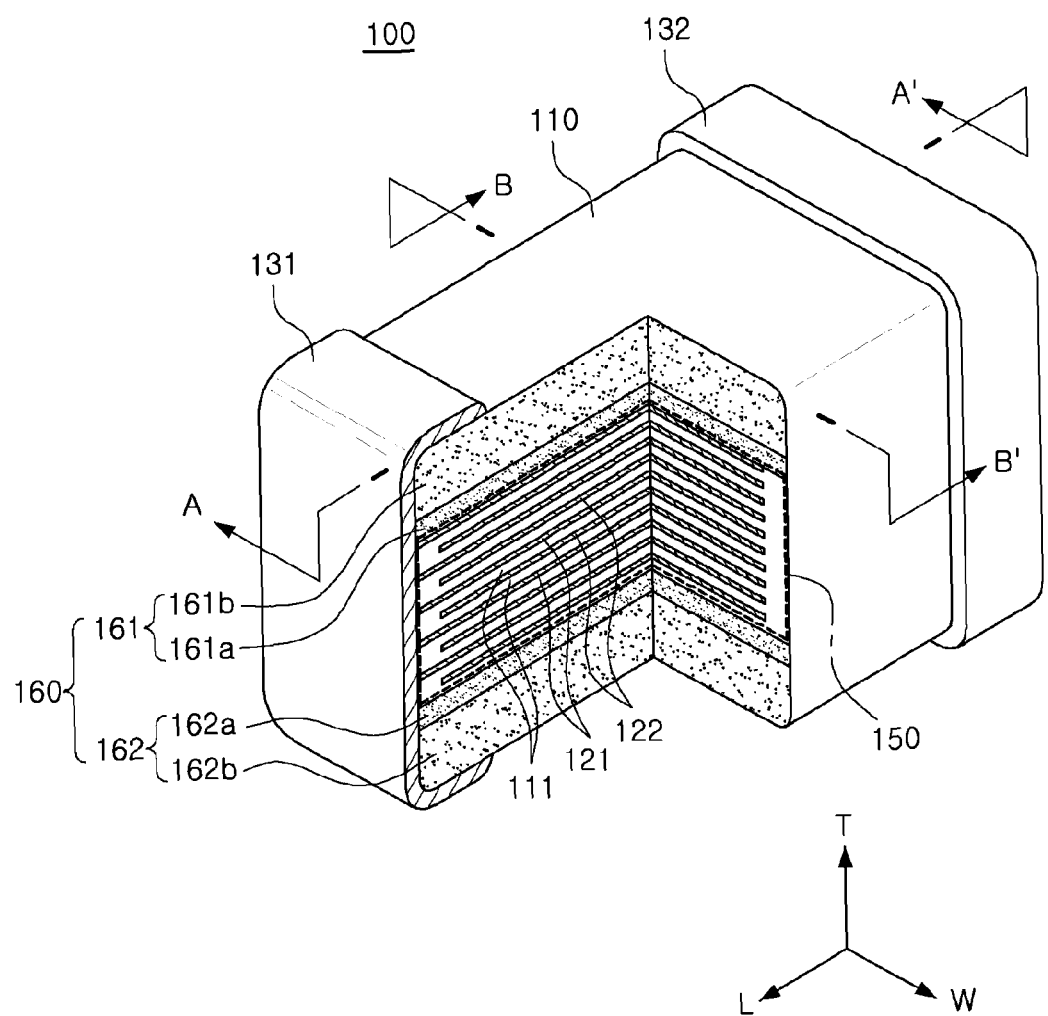
FIG. 1 is a partially cut-away perspective view schematically illustrating a multilayer ceramic capacitor according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the disclosure to those having ordinary skill in the art.

In the drawings, the shapes and dimensions of elements may be exaggerated for clarity, and the same reference numerals will be used throughout to designate the same or like elements.

Multilayer Ceramic Capacitor

Figure 2:
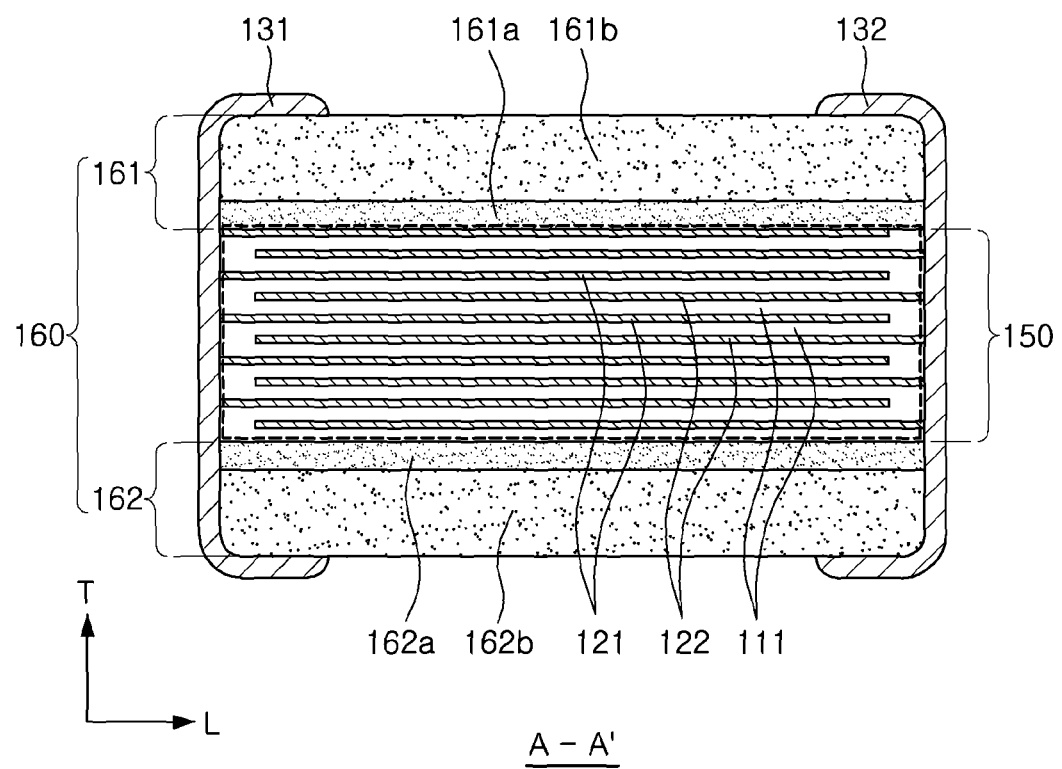
FIG. 2 is a cross-sectional view taken along line A-A' of FIG. 1.

FIG. 1 is a partially cut-away perspective view schematically illustrating a multilayer ceramic capacitor according to an exemplary embodiment of the present disclosure; FIG. 2 is a cross-sectional view taken along line A-A' of FIG. 1; and FIG. 3 is a cross-sectional view taken along line B-B' of FIG. 1.

Referring to FIG. 1, a multilayer ceramic capacitor 100 according to an exemplary embodiment of the present disclosure may include a ceramic body 110 and external electrodes 131 and 132.

Figure 3:
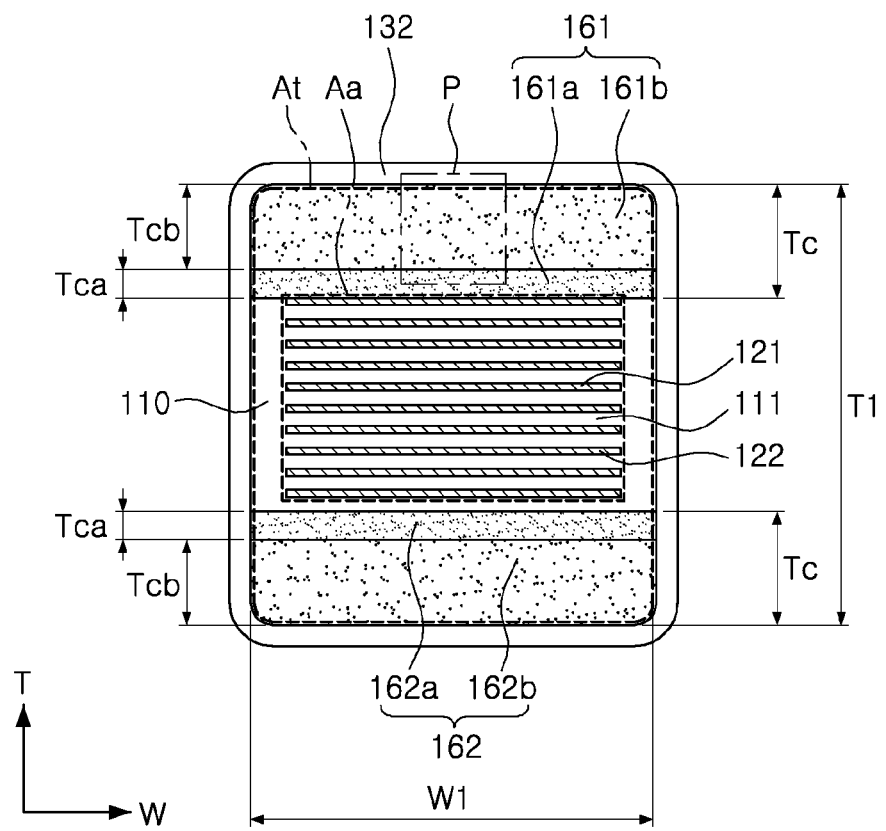
FIG. 3 is a cross-sectional view taken along line B-B' of FIG. 1.

According to the exemplary embodiment of the present disclosure, T, L, and W directions illustrated in FIGS. 1 through 3 refer to a thickness direction, a length direction, and a width direction of the ceramic body 110, respectively.

The thickness T direction refers to a direction in which internal electrodes and dielectric layers are stacked.

Referring to FIGS. 1 and 3, the ceramic body 110 may have first and second side surfaces opposing each other in the width direction, first and second end surfaces opposing each other in the length direction, and an upper surface and a lower surface opposing each other in the thickness direction. A shape of the ceramic body 110 is not particularly limited. For example, in addition to a hexahedral shape having perfectly straight lines, the ceramic body 110 may also have an approximately hexahedral shape, among other shapes.

The ceramic body 110 may include an active part 150 and a cover part 160.

The active part 150 may include a plurality of dielectric layers 111 and a plurality of internal electrodes 121 and 122. According to the exemplary embodiment of the present disclosure, as illustrated in FIG. 2, the dielectric layers 111 and the internal electrodes 121 and 122 may be stacked in the thickness T direction of the ceramic body 110.

According to an exemplary embodiment of the present disclosure, the active part 150 may be formed by alternately stacking the internal electrodes 121 and 122 and the dielectric layers 111.

Hereinafter, the dielectric layers included in the active part 150 will be referenced as first dielectric layers 111.

The cover part 160 may be disposed above and below the active part 150.

In the description of exemplary embodiments of the present disclosure, the terms "upper," "lower," "an upper surface," and "a lower surface" are based on the directionality of the drawings unless otherwise defined, which may change according to a direction in which the capacitor is mounted. They may be understood as one portion and another portion of the ceramic body in the thickness direction and one surface and another surface of the ceramic body opposing each other in the thickness direction, respectively. Here, the upper surface and the lower surface of the ceramic body may be understood as one surface and another surface opposing each other in the thickness direction of the ceramic body, respectively.

The first dielectric layers 111 may contain a ceramic material having high permittivity, for example, a barium titanate ($BaTiO_3$)-based powder or a strontium titanate ($SrTiO_3$)-based powder. However, the present disclosure is not limited thereto. Any material can be used as long as sufficient capacitance may be obtained.

In addition, the first dielectric layers 111 may further contain a ceramic additive, an organic solvent, a plasticizer, a binder, a dispersant, and the like, if necessary, in addition to the ceramic powder.

The ceramic additive may include a transition metal oxide or carbide, a rare earth element, magnesium (Mg), aluminum (Al), or the like, but are not limited thereto.

Here, a thickness of the first dielectric layers 111 may be arbitrarily changed depending on target capacitance of the multilayer ceramic capacitor 100.

The internal electrodes may include first and second internal electrodes 121 and 122. The first and second internal electrodes 121 and 122 may be alternately disposed with at least one of the first dielectric layers 111 interposed therebetween. The first and second internal electrodes 121 and 122 may be electrically insulated from each other by the interposed first dielectric layers 111.

The first and second internal electrodes 121 and 122, to which voltages having different polarities can be applied, respectively, may be, for example, formed by printing a conductive paste containing a conductive metal at a predetermined thickness on a surface of a first dielectric layer 111. The first internal electrodes 121 may be exposed through a first end surface of the ceramic body 110, and the second internal electrodes 122 may be exposed through a second end surface of the ceramic body 110.

The first and second internal electrodes 121 and 122 may be electrically connected to the external electrodes 131 and 132 through portions thereof exposed to the end surfaces of the ceramic body 110, respectively.

Accordingly, in the case in which the voltages are applied to the external electrodes 131 and 132, electric charges may be accumulated between the first and second internal electrodes 121 and 122 opposing each other. In this case, the capacitance of the multilayer ceramic capacitor 100 may be proportional to an area of the active part 150 in which the first and second internal electrodes 121 and 122 overlap each other.

In addition, the conductive metal contained in the conductive paste forming the first and second internal electrodes 121 and 122 may be nickel (Ni), copper (Cu), palladium (Pd), or an alloy thereof, but is not limited thereto.

The external electrodes 131 and 132 may be disposed on the first and second end surfaces of the ceramic body 110, respectively, and may be connected to the first and second internal electrodes 121 and 122, respectively. The external electrodes 131 and 132 may include a first external electrode 131 and a second external electrode 132, wherein the first external electrode 131 may be connected to the first internal electrodes 121 and the second external electrode 132 may be connected to the second internal electrodes 122.

The cover part 160 may be disposed on at least one of an upper surface and a lower surface of the active part 150. For example, the cover part 160 may be disposed on the upper surface and the lower surface of the active part 150. In another example, the cover part 160 may include an upper cover portion 161 disposed on the upper surface of the active part 150 and a lower cover portion 162 disposed on the lower surface of the active part 150.

According to an exemplary embodiment of the present disclosure, the cover part 160 may include active part protective covers 161a and 162a and exterior covers 161b and 162b. For example, the upper cover portion 161 may include an upper active part protective cover 161a and an upper exterior cover 161b, and the lower cover portion 162 may include a lower active part protective cover 162a and a lower exterior cover 162b.

The active part protective covers 161a and 162a may be disposed adjacent to the active part 150. The active part protective covers 161a and 162a may serve as an active part protective part protecting the active part 150 from physical or chemical stimulus.

According to an exemplary embodiment of the present disclosure, the active part protective covers 161a and 162a may include second dielectric layers. The active part protective covers 161a and 162a may include one or more second dielectric layers. In the case in which the active part protective covers 161a, 162a include two or more second dielectric layers, the second dielectric layers may be stacked in the thickness direction of the ceramic body 110. The plurality of second dielectric layers may be in a sintered state, and adjacent second dielectric layers may be integrated with each other so that boundaries therebetween are not readily apparent.

The second dielectric layer (s) may be formed of the same material as that of the first dielectric layer(s) 111. Alternatively, the second dielectric layer(s) may be formed of a material different from that of the first dielectric layer (s) 111 in order to improve protection efficiency of the active part 150.

According to an exemplary embodiment of the present disclosure, the exterior covers 161b and 162b may be disposed on the exterior of the active part protective covers 161a and 162a, respectively. For example, the upper exterior cover 161b may be disposed on an upper surface of the upper active part protective cover 161a, and the lower exterior cover 162b may be disposed on a lower surface of the lower active part protective cover 162a.

The exterior covers 161b and 162b together with the active part protective covers 161a and 162a may additionally protect the active part 150 from external stimulus.

According to an exemplary embodiment of the present disclosure, the exterior covers 161b and 162b may include third dielectric layers. The exterior covers 161b and 162b may include one or more third dielectric layers. In the case in which the exterior covers 161b and 162b include two or more third dielectric layers, the third dielectric layers may be stacked in the thickness direction of the ceramic body 110. The plurality of third dielectric layers may be in a sintered state, and adjacent third dielectric layers may be integrated with each other so that boundaries therebetween are not readily apparent.

The exterior covers 161b and 162b may be disposed on the exterior of the active part protective covers 161a and 162a to serve as a thickness reinforcing part reinforcing the thickness of the ceramic body 110.

The second dielectric layers included in the active part protective covers 161a and 162a and the third dielectric layers included in the exterior covers 161b and 162b may contain a ceramic material having high permittivity. For example, the second and third dielectric layers may contain a barium titanate ($BaTiO_3$)-based powder or a strontium titanate ($SrTiO_3$)-based powder.

In addition, the second and third dielectric layers may further contain a ceramic additive, an organic solvent, a plasticizer, a binder, a dispersant, and the like, if necessary, in addition to the ceramic powder.

The cover part 160 of the multilayer ceramic capacitor 100 needs to be formed to be relatively thick depending on an intended use, function, or shape of the multilayer ceramic capacitor 100. However, in the case in which the cover part 160 is formed to be relatively thick, it is not easy to remove residual carbon from the cover part 160, such that residual carbon in a sintering process of the ceramic body 110 may not be removed, but may remain in the ceramic body 110.

The ceramic body 110 may be formed by sintering a green sheet multilayer body in which green sheets on which an internal electrode paste is printed and green sheets on which the internal electrode paste is not printed are stacked. The green sheets on which the internal electrode paste is printed may form the active part 150, and the green sheets on which the internal electrode paste is not printed may form the cover part 160.

The green sheets may contain dielectric powder particles and a binder binding the dielectric powder particles to each other, and may further contain a solvent, other additives, and the like. The binder may contain a resin composition such as an epoxy resin. An organic component containing the binder, such as carbon (C), which is residual carbon removed at the time of sintering the green sheet multilayer body, may bond to oxygen (O) in the sintering process to thereby be discharged and removed from the multilayer body in the form of carbon dioxide ($CO_2$), or the like.

However, when the organic component is not removed while sintering the green sheet multilayer body to form the ceramic body so that the content of residual carbon within the ceramic body is high, withstand voltage characteristics of the multilayer ceramic capacitor may deteriorate. When a path for discharging residual carbon is not secure, cracks may occur in the ceramic body or chip-burst defects may occur. In the process of sintering the green sheet multilayer body, internal electrodes within the green sheet multilayer body may serve as a main path for discharging residual carbon. For example, the internal electrodes within the green sheet multilayer body may become a path for supplying oxygen (O) into the green sheet multilayer body and become a path for discharging carbon (C) bonded to oxygen (O) as carbon dioxide ($CO_2$).

For example, in the case in which thicknesses of the internal electrodes 121 and 122 are decreased in the multilayer ceramic capacitor, a thickness of the active part 150 may be decreased. However, in order to satisfy a specification of a general size chip of which a width and a thickness are similar to each other, when a thickness of the active part 150 is decreased, a thickness of the cover part 160 may increase to offset the decrease in the thickness of the active part.

When the internal electrodes 121 and 122 are thinned as described above, a ratio of the internal electrodes containing a metal as a main component is decreased, such that manufacturing costs of the multilayer ceramic capacitor may be decreased. However, if the thickness of the cover part 160 is increased, a carbon component may not be smoothly removed during the sintering process, and it may be difficult to remove residual carbon remaining within the ceramic body 110.

In the multilayer ceramic capacitor according to an exemplary embodiment of the present disclosure, since the cover part 160 includes the active part protective covers 161a and 162a and the exterior covers 161b and 162b, even in the case that the thickness of the cover part 160 is increased, residual carbon within the ceramic body 110 may be efficiently removed, such that an amount of residual carbon within the ceramic body 110 may be decreased.

FIG. 3 is a cross-sectional view taken along line B-B' of FIG. 1.

As illustrated in FIG. 3, according to the exemplary embodiment of the present disclosure, when a thickness and a width of the ceramic body 110 in a cross-section of the multilayer ceramic capacitor in a thickness-width (T-W) direction are T1 and W1, respectively, the ceramic body 110 may satisfy $0.95 \leq W1/T1 \leq 1.05$. According to the exemplary embodiment of the present disclosure, the width W1 and the thickness T1 of the ceramic body 110 may be similar to each other.

According to the exemplary embodiment of the present disclosure, when an overall cross-sectional area of the ceramic body 110 and a cross-sectional area of a capacitance forming part in the active part 150 in the cross-section of the ceramic body in the thickness-width (T-W) direction are At and Aa, respectively, as shown in FIG. 3, $0.1 \leq Aa/At \leq 0.5$ may be satisfied. For example, $0.1 \leq Aa/At \leq 0.5$ may be achieved by making the internal electrodes thin.

According to an exemplary embodiment of the present disclosure, when the thickness of the ceramic body 110 is T1 and a thickness of the upper or lower cover portion (161 or 162) of the cover part 160 is Tc, $0.25 \leq Tc/T1$ may be satisfied.

According to an exemplary embodiment of the present disclosure, the thickness of the upper or lower cover portion (161 or 162) of the cover part 160 may be ½ or more of the thickness of the active part 150.

However, in the case in which the cross-sectional area of the capacitance forming part is small as compared to the overall cross-sectional area of the ceramic body 110, or the thickness of the cover part 160 is thick, it may be difficult to remove the residual carbon from the cover part 160.

In the multilayer ceramic capacitor according to the exemplary embodiment of the present disclosure, since the cover part 160 includes the active part protective covers 161a and 162a and the exterior covers 161b and 162b as described above, even if the thickness of the cover part 160 is increased, the residual carbon within the ceramic body 110 may be efficiently removed, such that an amount of residual carbon within the ceramic body 110 may be decreased.

The active part protective covers 161a and 162a and the exterior covers 161b and 162b may be formed of different materials.

According to an exemplary embodiment of the present disclosure, the residual carbon may be removed more rapidly through the exterior covers 161b and 162b than through the active part protective covers 161a and 162a.

The active part protective cover and the exterior cover may be in a sintered state, and may be integrated with each other so that a boundary therebetween is not readily apparent without using a microscope. They may, however, be distinguished from each other by differences in porosity, composition, grain size, and the like.

Figure 4A:
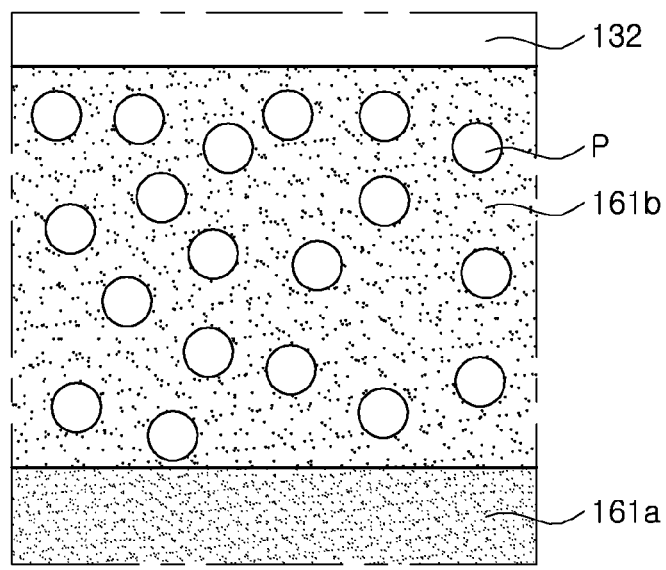
FIGS. 4A through 4C are enlarged views of region P of FIG. 3, illustrating examples of an active part protective cover and an exterior cover.
Figure 4B:
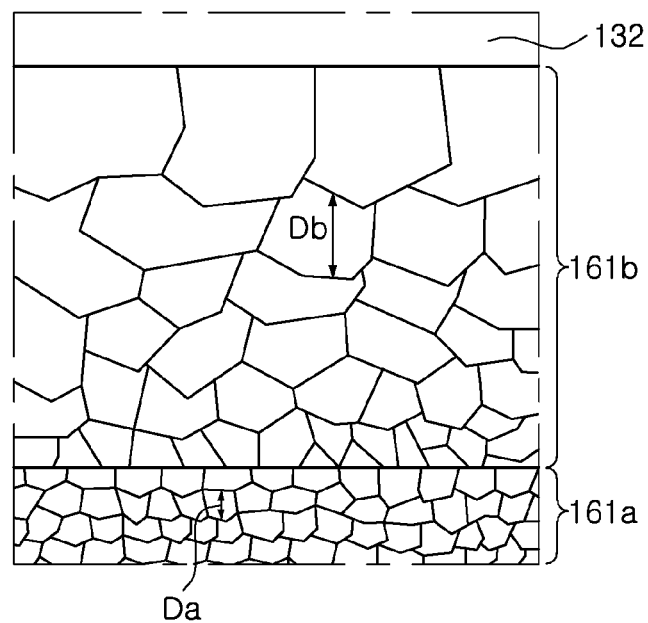
Figure 4C:
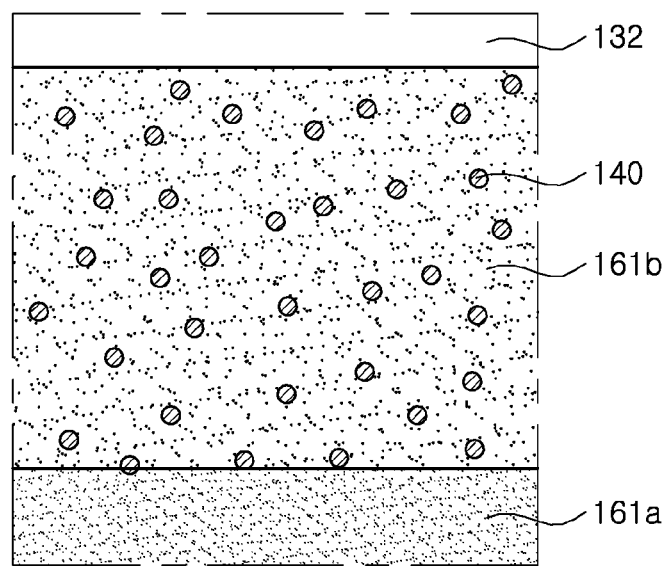

FIGS. 4A through 4C are enlarged views of region P denoted in FIG. 3, illustrating examples of an active part protective cover and an exterior cover in an exemplary case in which the active part protective covers 161a or 162a and the exterior covers 161b or 162b are formed of different materials. Although the enlarged views of region P shown in FIGS. 4A through 4C illustrate a partial region of the upper cover portion 161, these enlarged views may also be similarly applied to the lower cover portion 162.

According to the example shown in FIG. 4A, the exterior covers 161b and 162b may have a higher porosity than that of the active part protective covers 161a and 162a.

In the active part protective covers 161a and 162a relatively adjacent to the internal electrodes 121 and 122, residual carbon may be relatively easily removed through the internal electrodes 121 and 122, whereas the exterior covers 161b and 162b are relatively distant from the internal electrodes, such that removal efficiency of the residual carbon may be lower. However, in the case in which the exterior covers 161b and 162b have a higher porosity than that of the active part protective covers 161a and 162a, pores P serve as a residual carbon removal path, whereby a removal rate of the residual carbon in the exterior covers 161b and 162b may be improved.

According to the exemplary embodiment of the present disclosure, the porosity in the exterior covers 161b and 162b may be 12 vol % to 43 vol %. According to the exemplary embodiment of the present disclosure, the active part protective covers 161a and 162a do not include a substantial amount of pores, e.g., the porosity in the active part protective covers 161a or 162a may be 1 vol % or less.

The porosity in the exterior covers 161b and 162b may be a ratio of a volume of the pores P to an overall volume of the exterior covers 161b and 162b. For example, as noted above, the porosity in the exterior covers 161b and 162b may be 12 vol % to 43 vol %.

If the porosity in the exterior covers 161b and 162b is less than 12 vol %, the removal efficiency of the residual carbon from the exterior covers may be reduced, such that cracks may occur in the ceramic body 110. On the other hand, if the porosity in the exterior covers 161b and 162b exceeds 43 vol %, the strength of the ceramic body 110 is decreased, such that the ceramic body 110 may be broken or ruptured.

The pores may be formed by a pore former. The pore former may include one or more selected from a group consisting of, for example, polyvinylpyrrolidone (PVP), polyvinylalcohol (PVA), polyethyleneglycol (PEG) and polyacrylic acid (PAA), but is not limited thereto. That is, various materials may be used as the pore former so long as they may be contained in the green sheets to form pores in the exterior covers. The pore former may be contained in the green sheets for the exterior covers and be decomposed when a predetermined level of heat is applied in processes such as plasticizing and sintering the green sheets. The pore former may also be decomposed before the sintering of the dielectric powder contained in the green sheets to thereby form the pores in the green sheets.

Referring to FIG. 3, according to the exemplary embodiment of the present disclosure, a thickness Tca of the active part protective cover 161a or 162a may be 0.5 μm to 100 μm. If the thickness of the active part protective cover 161a or 162a is less than 0.5 μm, a moisture resistance defect may be increased. On the other hand, if the thickness of the active part protective covers 161a or 162a exceeds 100 μm, the residual carbon may not be smoothly removed so as to cause a defect.

A thickness Tcb of the exterior cover 161b or 162b may be appropriately adjusted depending on the overall thickness T1 of the ceramic body 110 and the thickness Tca of the active part protective cover 161a or 162a.

According to the example shown in FIG. 4B, an average diameter Db of dielectric grains contained in the exterior covers 161b and 162b may be larger than an average diameter Da of dielectric grains contained in the active part protective covers 161a and 162a.

The active part protective covers 161a and 162a and the exterior covers 161b and 162b may be formed by sintering the green sheets containing the dielectric powders, and the dielectric powders may be transformed into the dielectric grains during the sintering process.

The green sheets for forming the exterior covers 161b and 162b may be manufactured using a dielectric powder having a larger particle size than that of a dielectric powder of the green sheets for forming the active part protective covers 161a and 162a. Accordingly, the average diameter of the grains contained in the exterior covers 161b and 162b may be larger than that of the grains contained in the active part protective covers 161a and 162a.

The reason for which the average diameter of the dielectric grains contained in the exterior covers 161b and 162b is larger than that of the dielectric grains contained in the active part protective covers 161a and 162a will be described below.

The dielectric powder may be sintered at a lower temperature as the surface area thereof is increased. Here, as the surface area of the dielectric powder is increased, surface energy is also increased, such that the dielectric powder is generally in an unstable state in terms of energy, and thus, the dielectric powder may be stabilized by lowering the degree of surface energy thereof, which may act as driving force for sintering.

Small gaps between the dielectric powder particles contained in the active part protective covers 161a and 162a and the exterior covers 161b and 162b may serve as residual carbon removal paths, similar to the pores, in the sintering process.

Here, in the case in which the green sheets for forming the exterior covers 161b and 162b contain dielectric powder having a larger grain size than that of the dielectric powder of the green sheets for forming the active part protective covers 161a and 162a, gaps between the dielectric powder particles contained in the green sheets for forming the exterior covers may be greater than those between the dielectric powder particles contained in the green sheets for forming the active part protective covers. Accordingly, the residual carbon removal path in the green sheets for forming the exterior covers is wider than that in the green sheets for forming the active part protective covers, whereby a removal rate of the residual carbon may be increased and a problem resulting from an increase in the thickness of the cover part 160 may be solved.

In addition, in the case in which the green sheets for forming the active part protective covers contain dielectric powder having a smaller particle size than that of the dielectric powder of the green sheets for forming the exterior covers, the sintering process may occur more rapidly in the active part protective covers 161a and 162a than in the exterior covers 161b and 162b. For example, the beginning of sintering in the active part protective covers 161a and 162a may occur in advance of the beginning of sintering in the exterior covers 161b and 162b. The order of the sintering is only conceptually described and is not absolute. In practice, the sintering of the active part protective covers 161a and 162a and the sintering of the exterior covers 161b and 162b may overlap. Since the sintering of the active part protective covers 161a and 162a disposed inwardly of the exterior covers 161b and 162b occurs more rapidly than the sintering of the exterior covers 161b and 162b, the residual carbon contained in the active part protective covers 161a and 162a may be first discharged through the internal electrodes and the gaps between the dielectric powder particles contained in the exterior covers 161b and 162b before being sintered. Then, the sintering of the exterior covers 161b and 162b occurs, whereby an amount of residual carbon within the cover part 160 may be decreased relative to a case in which the active part protective covers and the exterior covers are simultaneously sintered.

The average diameters Da and Db of the dielectric grains contained in the active part protective covers 161a and 162a and the exterior covers 161b and 162b, respectively, may be measured by analyzing photographs of cross sections of an active part protective cover region and an exterior cover region extracted by a scanning electron microscope (SEM). For example, the average diameters Da and Db of the dielectric grains may be measured using grain size measurement software supporting a standard method of measuring an average size of grains defined in American Society for Testing and Materials (ASTM) Standard E112.

For example, a sample of regions containing thirty or more dielectric grains may be selected from the active part protective covers 161a and 162a and the exterior covers 161b and 162b, and the average diameter of the dielectric grains may be measured using the above-mentioned method. The sampling process may be performed on an image, captured by an SEM, of a cross section of a central portion of the ceramic body 110, among portions of the ceramic body 110 trisected in the length L direction, cut in a width-thickness (W-T) direction.

According to an exemplary embodiment of the present disclosure, as illustrated in FIG. 4B, diameters of the grains contained in the exterior covers 161b and 162b may be reduced in a direction toward the active part protective covers. Accordingly, a portion of the exterior covers adjacent to the active part protective covers may be initially sintered as compared with the other portions of the exterior covers, whereby the removal efficiency of residual carbon in the exterior covers may be further improved.

According to the example shown in FIG. 4C, the exterior covers 161b and 162b may further contain metal particles 140. The exterior covers 161b and 162b may contain 0.08 wt % to 8 wt %, and more preferably, 0.8 wt % to 4 wt %, of the metal particles 140.

The cover part 160 may be formed by sintering the green sheets forming the active part protective covers 161a and 162a or the green sheets forming the exterior covers 161b and 162b.

Since the green sheets forming the active part protective covers 161a and 162a are adjacent to the active part 150 of the ceramic body 110, oxygen (O) may be relatively smoothly supplied thereto through the internal electrodes in the sintering process. However, since the green sheets forming the exterior covers 161b and 162b are relatively distant from the internal electrodes, it may be difficult to supply oxygen (O) thereto.

However, according to the example of FIG. 4C, since the exterior covers 161b and 162b are formed by sintering the green sheets containing peroxidized metal particles, organic components within the exterior covers may be efficiently decomposed, whereby an amount of residual carbon within the ceramic body 110 may be decreased.

The peroxidized metal particles may be, for example, nickel dioxide ($NiO_2$) particles.

A reaction formula through which nickel dioxide ($NiO_2$) is reduced to generate oxygen (O), and the oxygen (O) reacts to carbon (C) contained in the exterior covers to generate carbon dioxide ($CO_2$), may be represented by the following Chemical Formula 1 and Formula 2.

$NiO_2 \rightarrow Ni + O_2$ [Chemical Formula 1]

$C + O_2 \rightarrow CO_2$ [Chemical Formula 2]

The peroxidized metal particles contained in the green sheets for the exterior covers may be reduced to the metal particles 140 within the exterior covers 161b and 162b in the sintering process.

Accordingly, according to the exemplary embodiment of the present disclosure, in the case in which the exterior covers are formed by sintering the green sheets containing the peroxidized metal particles, the exterior covers may contain the metal particles formed by reducing the peroxidized metal particles. Accordingly, the amount of residual carbon within the ceramic body may be decreased.

According to the exemplary embodiment of the present disclosure, the green sheets forming the exterior covers may contain 0.1 wt % to 10 wt % of the peroxidized metal particles.

The green sheets forming the exterior covers may contain 1 wt % to 5 wt % of the peroxidized metal particles.

According to the exemplary embodiment of the present disclosure, the peroxidized metal particles may have a particle size of 50 nm to 200 nm.

Method of Manufacturing Multilayer Ceramic Capacitor

Figure 5:
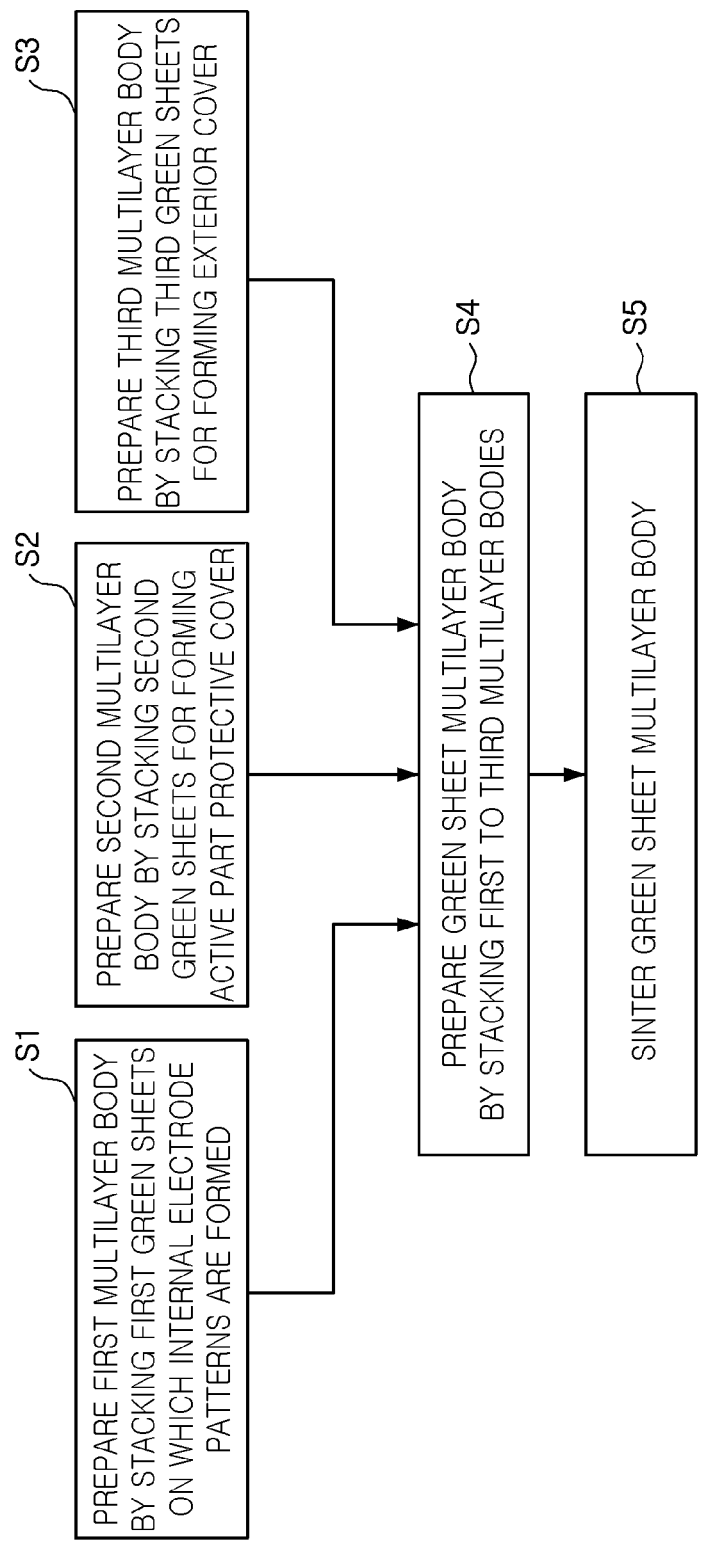
FIG. 5 is a flowchart illustrating a method of manufacturing a multilayer ceramic capacitor according to an exemplary embodiment of the present disclosure.

FIG. 5 is a flowchart illustrating a method of manufacturing a multilayer ceramic capacitor according to an exemplary embodiment of the present disclosure; and FIGS. 6A through 6J are cross-sectional and perspective views schematically illustrating the method of manufacturing a multilayer ceramic capacitor according to an exemplary embodiment of the present disclosure.

Referring to FIG. 5, the method of manufacturing a multilayer ceramic capacitor according to this exemplary embodiment of the present disclosure may include preparing a first multilayer body (S1), preparing a second multilayer body (S2), preparing a third multilayer body (S3), stacking the first to third multilayer bodies to prepare a green sheet multilayer body (S4), and sintering the green sheet multilayer body (S5).

Figure 6A:
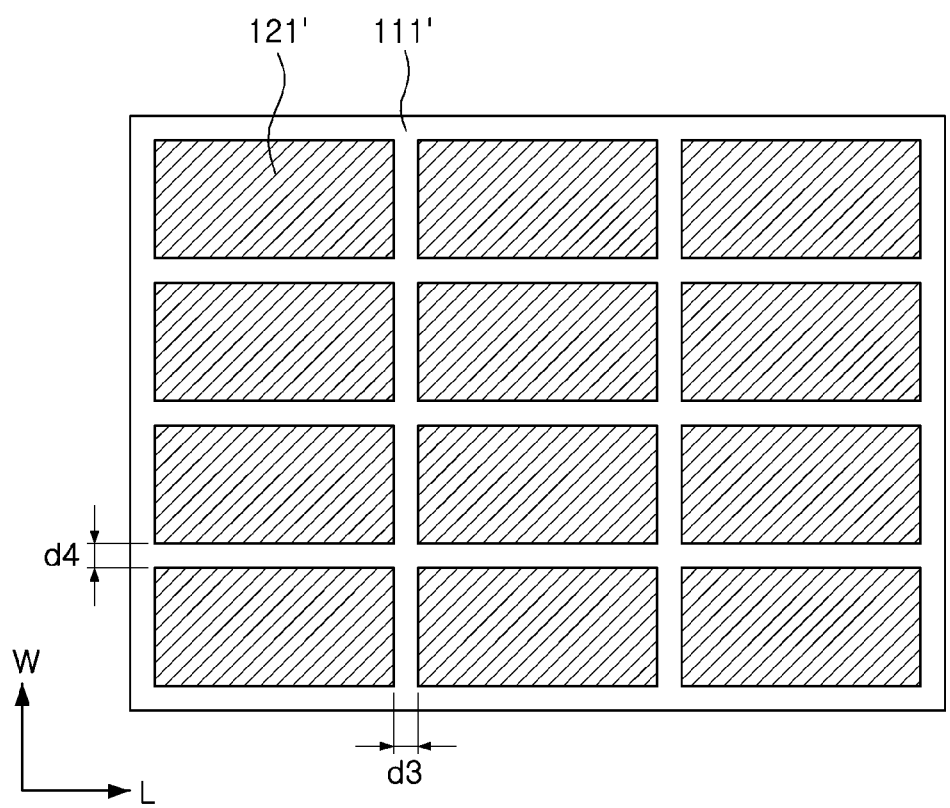
FIGS. 6A through 6J are cross-sectional and perspective views schematically illustrating the method of manufacturing a multilayer ceramic capacitor according to an exemplary embodiment of the present disclosure.
Figure 6B:
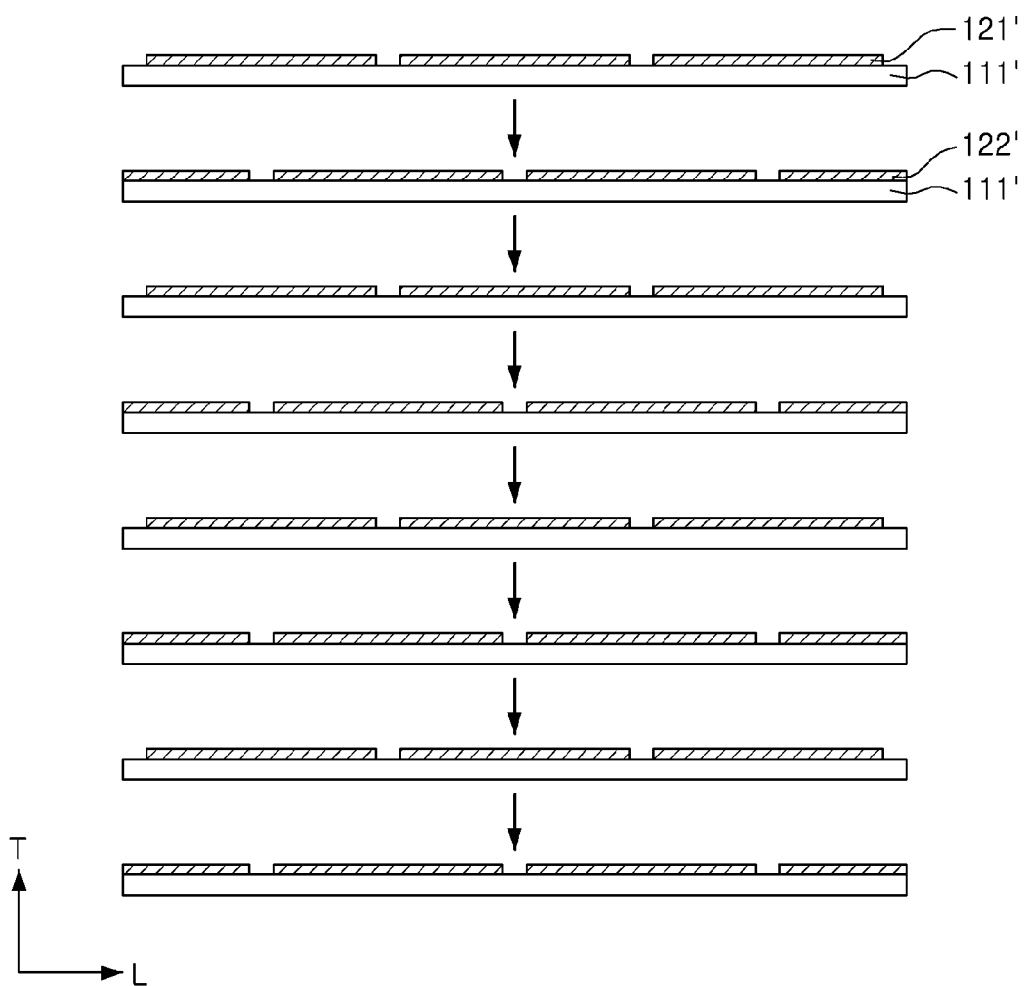
Figure 6C:
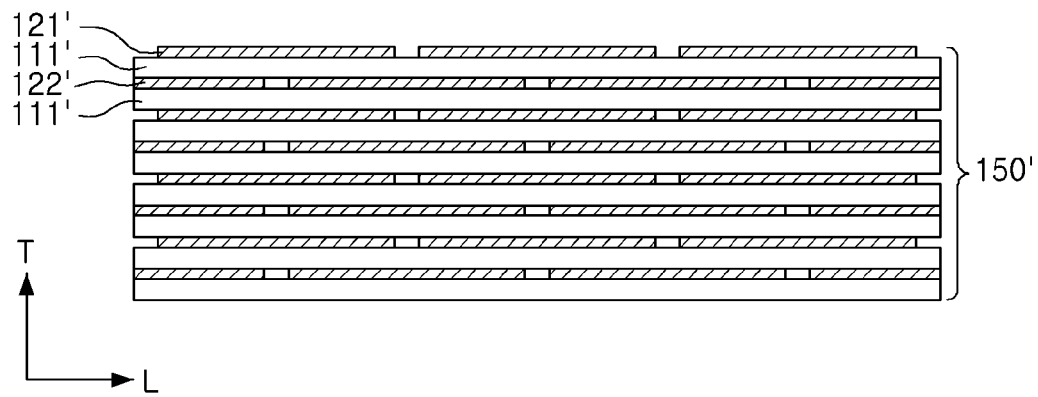

The preparing of the first multilayer body (S1) may be performed as illustrated in FIGS. 6A through 6C. First, as illustrated in FIG. 6A, a plurality of first internal electrode patterns 121' may be formed on a first green sheet 111', having predetermined intervals d3 in a length direction of the green sheet and predetermined intervals d4 in a width direction of the green sheet. The plurality of first internal electrode patterns 121' may be arranged in a matrix form.

The predetermined intervals d3 in the length direction may be distances for insulating internal electrodes from external electrodes having different polarities; and the predetermined intervals d4 in the width direction, margins of a ceramic body in the width direction, may be distances between the internal electrodes and the first and second side surfaces of the ceramic body.

The first green sheet 111' may be formed of a ceramic paste containing a ceramic powder, an organic solvent, and an organic binder.

The ceramic powder having high permittivity may be a barium titanate ($BaTiO_3$)-based material, a lead composite perovskite-based material, a strontium titanate ($SrTiO_3$)-based material, or the like. The ceramic powder may be a barium titanate ($BaTiO_3$) powder, but is not limited thereto. When the first green sheet 111' is sintered, it may become a first dielectric layer 111 included in an active part.

The first internal electrode patterns 121' may be formed of an internal electrode paste containing a conductive metal. The conductive metal may be nickel (Ni), copper (Cu), palladium (Pd), or an alloy thereof, but is not limited thereto.

The method of forming the first internal electrode patterns 121' on the first green sheet 111' is not particularly limited, but may be a printing method such as a screen printing method or a gravure printing method.

In addition, although not illustrated, a plurality of second internal electrode patterns 122' may be formed on another first green sheet 111', while having predetermined intervals d3 and d4 therebetween.

Next, as illustrated in FIG. 6B, the first green sheets may be stacked so that the first internal electrode patterns 121' and the second internal electrode patterns 122' may be alternately stacked to prepare the first multilayer body 150' illustrated in FIG. 6C.

For example, the first green sheets may be stacked so that central portions of the first internal electrode patterns 121' printed on one first green sheet and the intervals d3 in the length direction between the second internal electrode patterns 122' printed on another first green sheet overlap each other.

In addition, the first green sheets may be stacked so that the intervals d4 in the width direction between the first internal electrode patterns 121' printed on one first green sheet and the intervals d4 in the width direction between the second internal electrode patterns 122' printed on another first green sheet overlap each other.

The preparing of the second multilayer body (S2) may be performed separately from the preparing of the first multilayer body (S1).

Figure 6D:
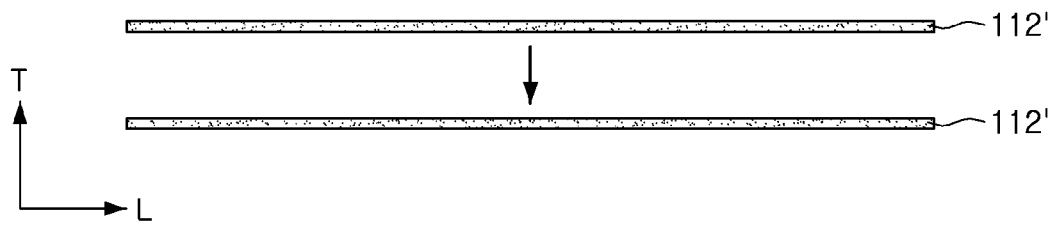
Figure 6E:
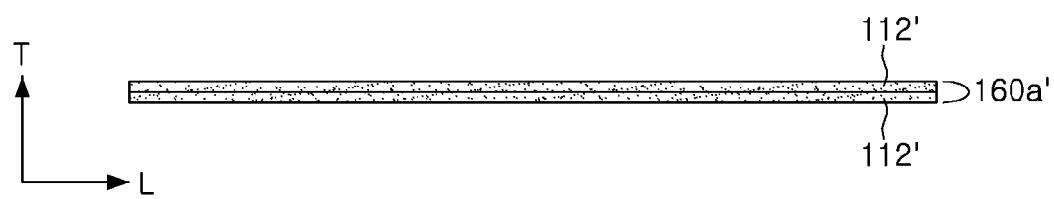

In preparing the second multilayer body, second green sheets 112' for forming an active part protective cover may be prepared as illustrated in FIG. 6D, and the second green sheets 112' may be stacked to prepare the second multilayer body 160a' illustrated in FIG. 6E.

The second green sheet 112' may be formed of a ceramic paste containing a ceramic powder, an organic solvent, and an organic binder.

The preparing of the third multilayer body (S3) may be performed separately from the preparing of the first multilayer body (S1) and the preparing of the second multilayer body (S2).

Figure 6F:
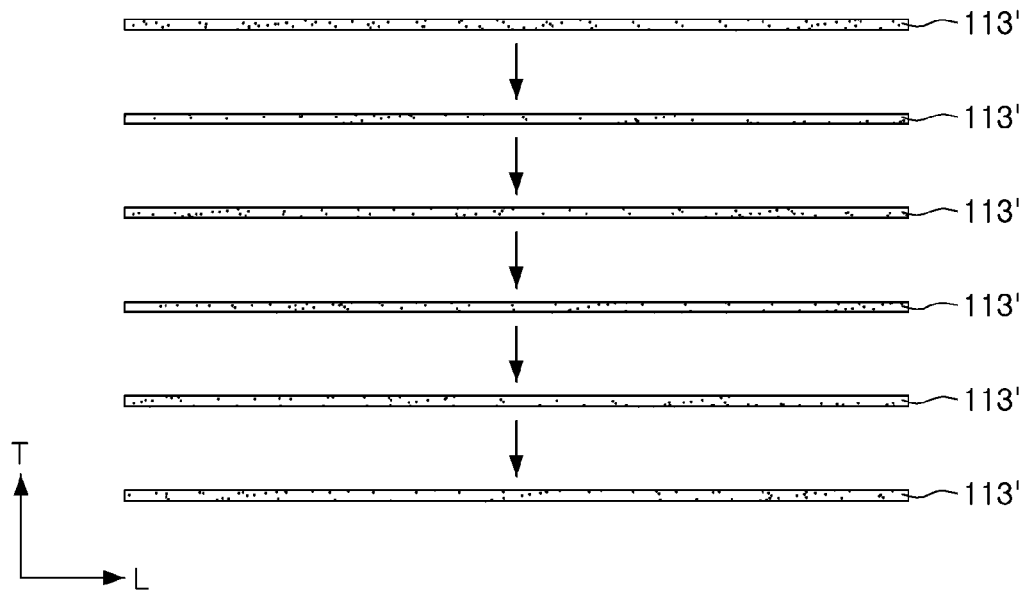
Figure 6G:
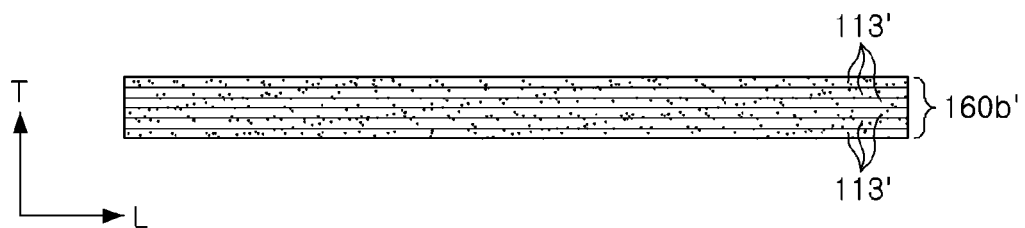

In preparing the third multilayer body, third green sheets 113' for forming an exterior cover may be prepared as illustrated in FIG. 6F, and the third green sheets may be stacked to prepare the third multilayer body 160b' illustrated in FIG. 6G.

The third green sheet 113' may be formed of a ceramic paste containing a ceramic powder, an organic solvent, and an organic binder.

Further, as mentioned in the description of the multilayer ceramic capacitor, the third green sheets 113' may be formed in several forms to improve a removal rate of residual carbon.

As an example, the third green sheets 113' may contain a pore former causing the exterior cover to include pores, and porosity in the exterior cover may be 12 vol % to 43 vol %.

As another example, the ceramic powder of the third green sheets 113' may have a larger particle size than that of the ceramic powder of the second green sheets 112', to improve the removal rate of the residual carbon.

As yet another example, the third green sheets 113' may further contain peroxidized metal particles to allow the peroxidized metal particles to discharge oxygen (O), while being reduced in the sintering process, thereby improving the removal rate of the residual carbon.

Hereinafter, details of the third green sheets 113' overlapping those of the above-described multilayer ceramic capacitor will be omitted.

Figure 6H:
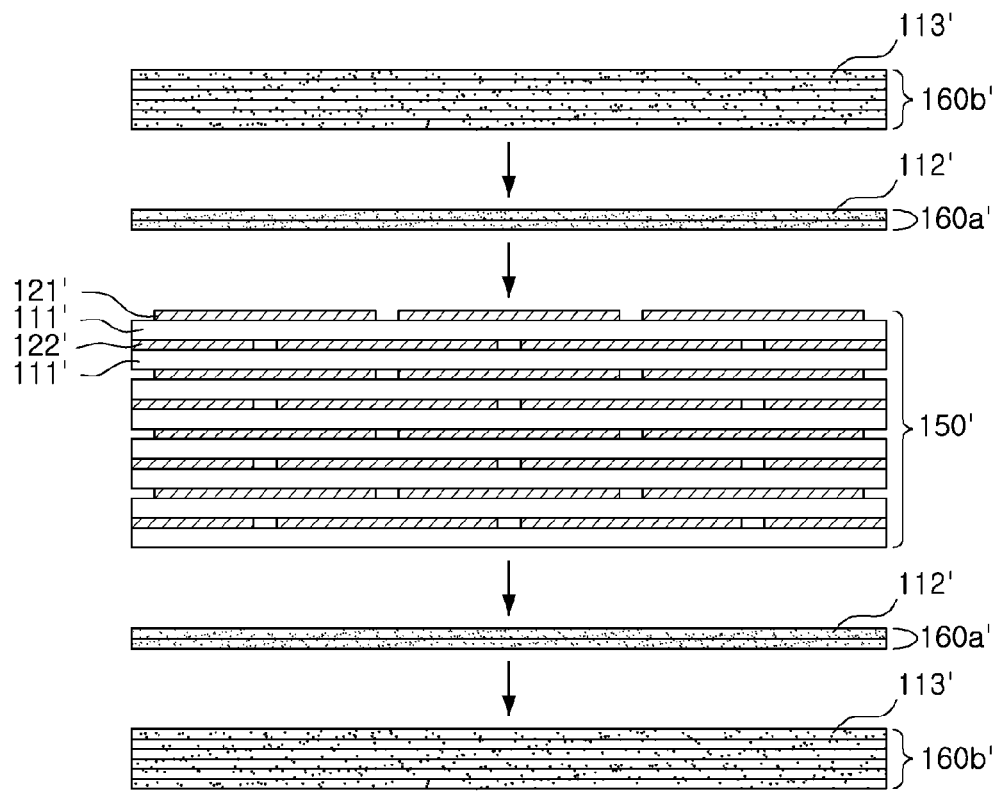
Figure 6I:
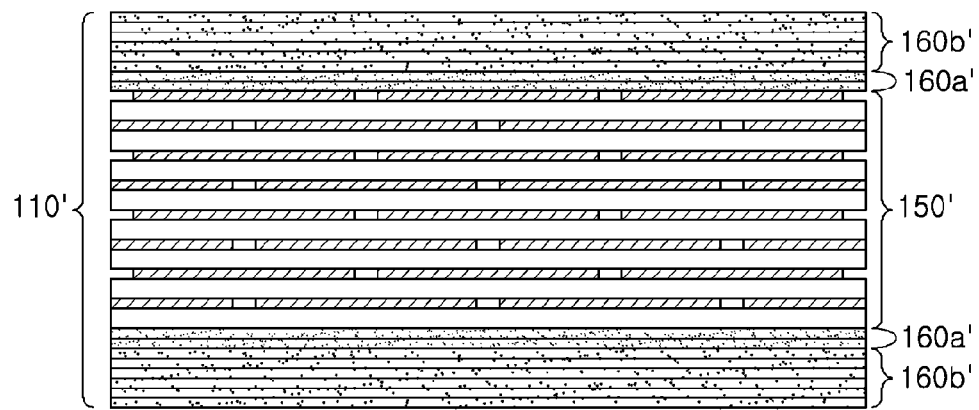

Then, the first multilayer body 150', the second multilayer body 160a', and the third multilayer body 160b' may be stacked as illustrated in FIG. 6H to form the green sheet multilayer body 110' illustrated in FIG. 6I.

Figure 6J:
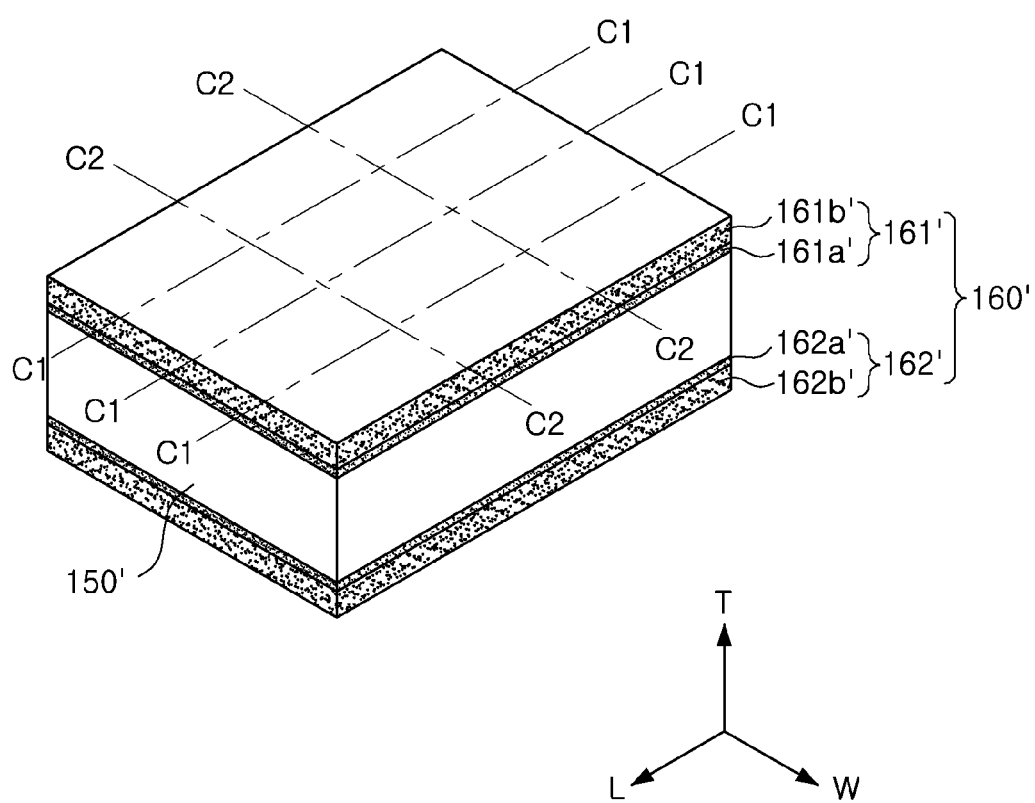

Next, the green sheet multilayer body 110' may be pressed and then cut as illustrated in FIG. 6J. For example, the green sheet multilayer body 110' may be cut into portions having individual chip sizes along cutting lines C1-C1 and C2-C2 so as to traverse regions C1-C1 in which the central portions of the first internal electrode patterns 121' printed on one first green sheet and the intervals d3 in the length direction between the second internal electrode patterns 122' printed on another first green sheet overlap each other, and so as to traverse regions C2-C2 in which the intervals d4 in the width direction between the first internal electrode patterns 121' printed on one first green sheet and the intervals d4 in the width direction between the second internal electrode patterns 122' printed on another first green sheet overlap each other, respectively.

Next, after the green sheet multilayer body 110' is cut into the portions having individual chip sizes, sintering may be performed thereon to form ceramic bodies. The sintering process may be performed under an $N_2$—$H_2$ atmosphere at a temperature of 1100 C.° to 1300 C.°, but is not limited thereto. The method of manufacturing a multilayer ceramic capacitor may further include plasticizing the green sheet multilayer body 110' before the sintering process.

Alternatively, the plasticizing and sintering processes may be performed before the green sheet multilayer body 110' is cut into the portions having individual chip sizes.

Next, the external electrodes 131 and 132 may be formed on respective surfaces of the ceramic body at which the internal electrodes are exposed.

According to the exemplary embodiment of the present disclosure, the individual second and third green sheets 112' and 113' for forming a cover part are not necessarily directly stacked on the first multilayer body 150', but may instead be manufactured as the second and third multilayer bodies 160a' and 160b', respectively, and may then be stacked on the first multilayer body 150', thereby decreasing an amount of stress applied to the first multilayer body 150' for forming the active part 150.

In a case in which individual second and third green sheets are repeatedly stacked on the first multilayer body 150' to form a multilayer body for a cover part on the first multilayer body 150', non-uniform pressure may be exerted on the first multilayer body every time the second green sheets and the third green sheets are stacked, acting as a stacking stress.

If stress is excessively exerted on the first multilayer body, it may affect the first green sheets and the internal electrode patterns within the first multilayer body, such that breakdown voltage (BDV) characteristics may deteriorate and electrical short-circuits may occur due to spreading of the internal electrode patterns.

Figure 7:
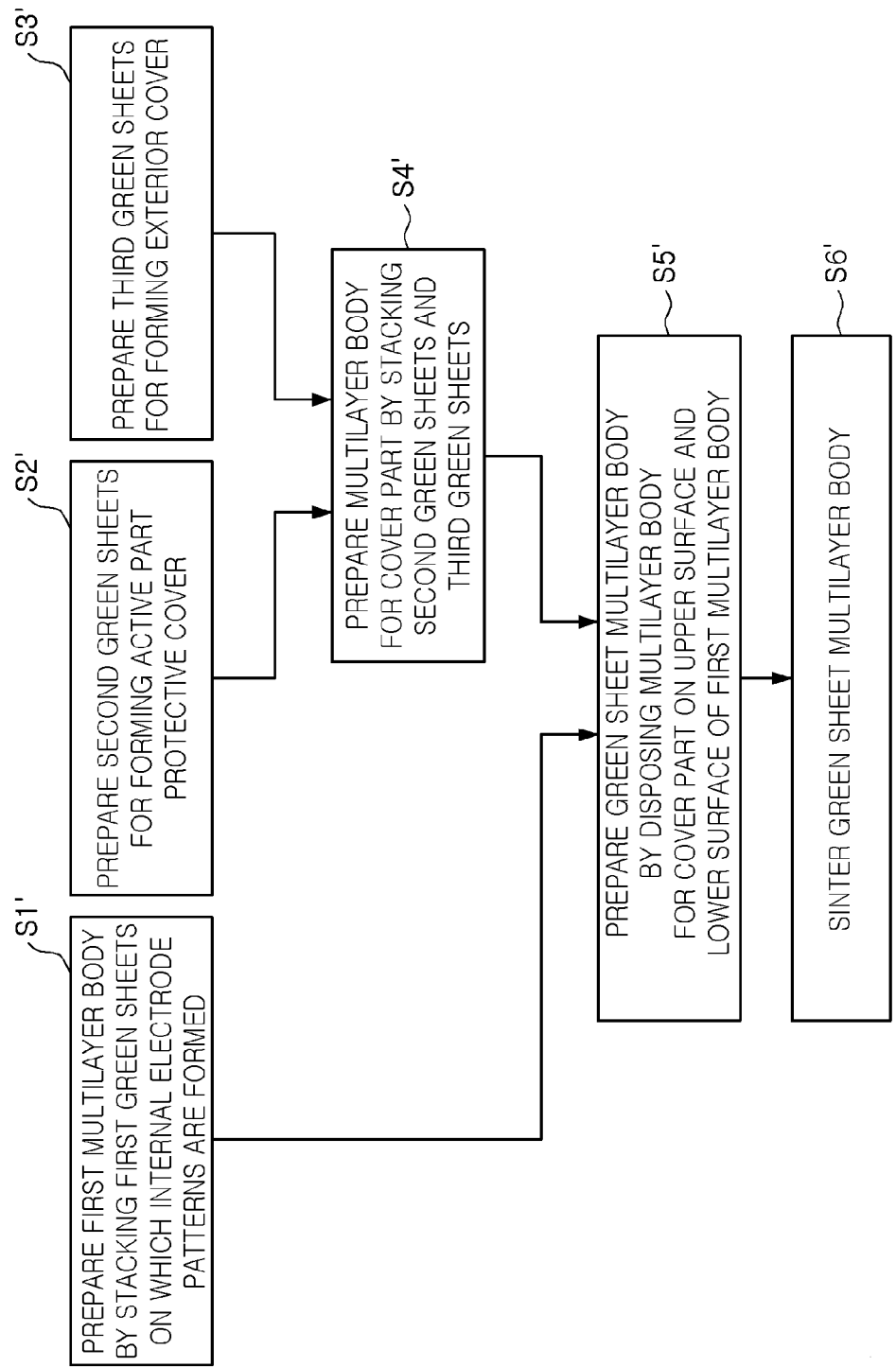
FIG. 7 is a flowchart illustrating a modified example of a method of manufacturing a multilayer ceramic capacitor according to an exemplary embodiment of the present disclosure.
Figure 8:
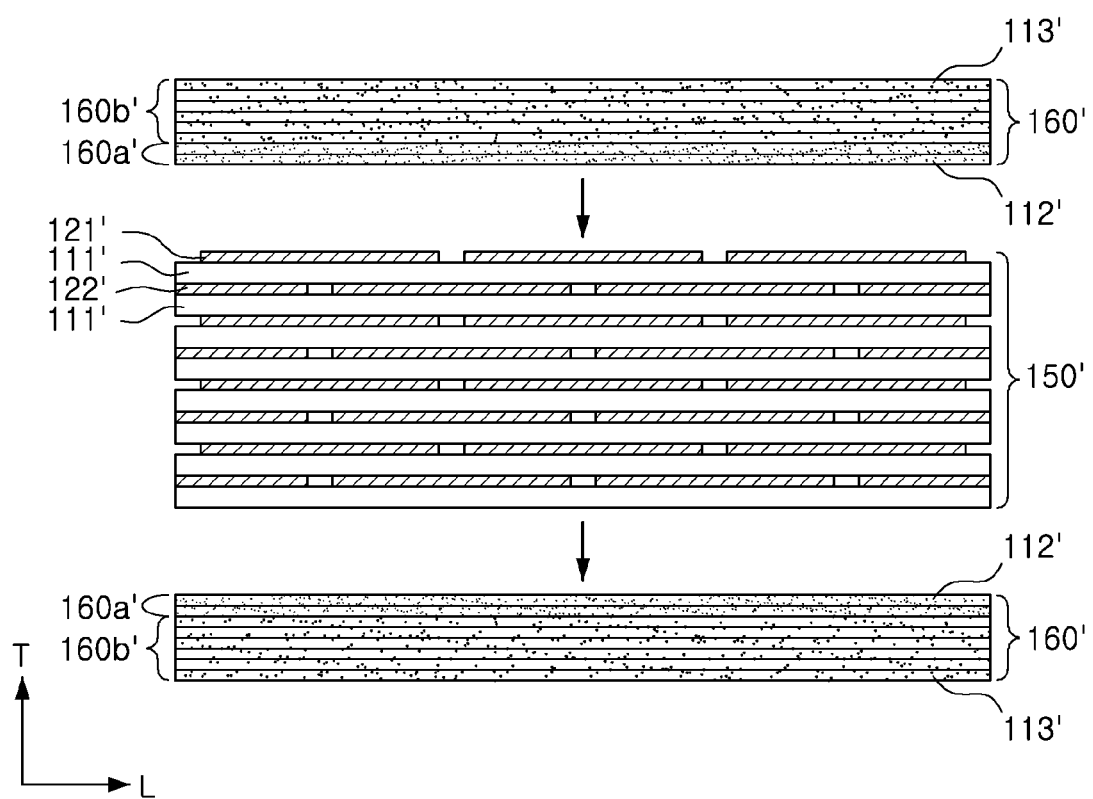
FIG. 8 is a cross-sectional view illustrating a particular process in the modified example of the method of manufacturing a multilayer ceramic capacitor according to an exemplary embodiment of the present disclosure.

FIG. 7 is a flowchart illustrating a modified example of a method of manufacturing a multilayer ceramic capacitor according to an exemplary embodiment of the present disclosure; and FIG. 8 is a cross-sectional view illustrating a particular process in the modified example.

Referring to FIG. 7, the method of manufacturing a multilayer ceramic capacitor according to the present modified example may include preparing a first multilayer body by stacking first green sheets on which internal electrode patterns are formed (S1'), preparing second green sheets for forming an active part protective cover separately from the preparing of the first multilayer body (S2'), preparing third green sheets for forming an exterior cover separately from the preparing of the first multilayer body and the preparing of the second green sheets (S3'), preparing a multilayer body for a cover part by stacking the second green sheets and the third green sheets (S4'), preparing a green sheet multilayer body by disposing the multilayer body for a cover part on at least one of an upper surface and a lower surface of the first multilayer body (S5'), and sintering the green sheet multilayer body (S6').

For example, the multilayer body for a cover part may be disposed on the upper surface and the lower surface of the first multilayer body.

According to the present modified example, as illustrated in FIG. 8, since the second green sheets 112' and the third green sheets 113' are stacked to prepare the multilayer body 160' for a cover part, and the multilayer body 160' is disposed on at least one of the upper surface and the lower surface of the first multilayer body 150', an amount of stress exerted on the first multilayer body 150' may be decreased as compared to a case in which the second multilayer body and the third multilayer body are individually disposed on at least one of the upper surface and the lower surface of the first multilayer body 150'.

Board Having Multilayer Ceramic Capacitor

Figure 9:
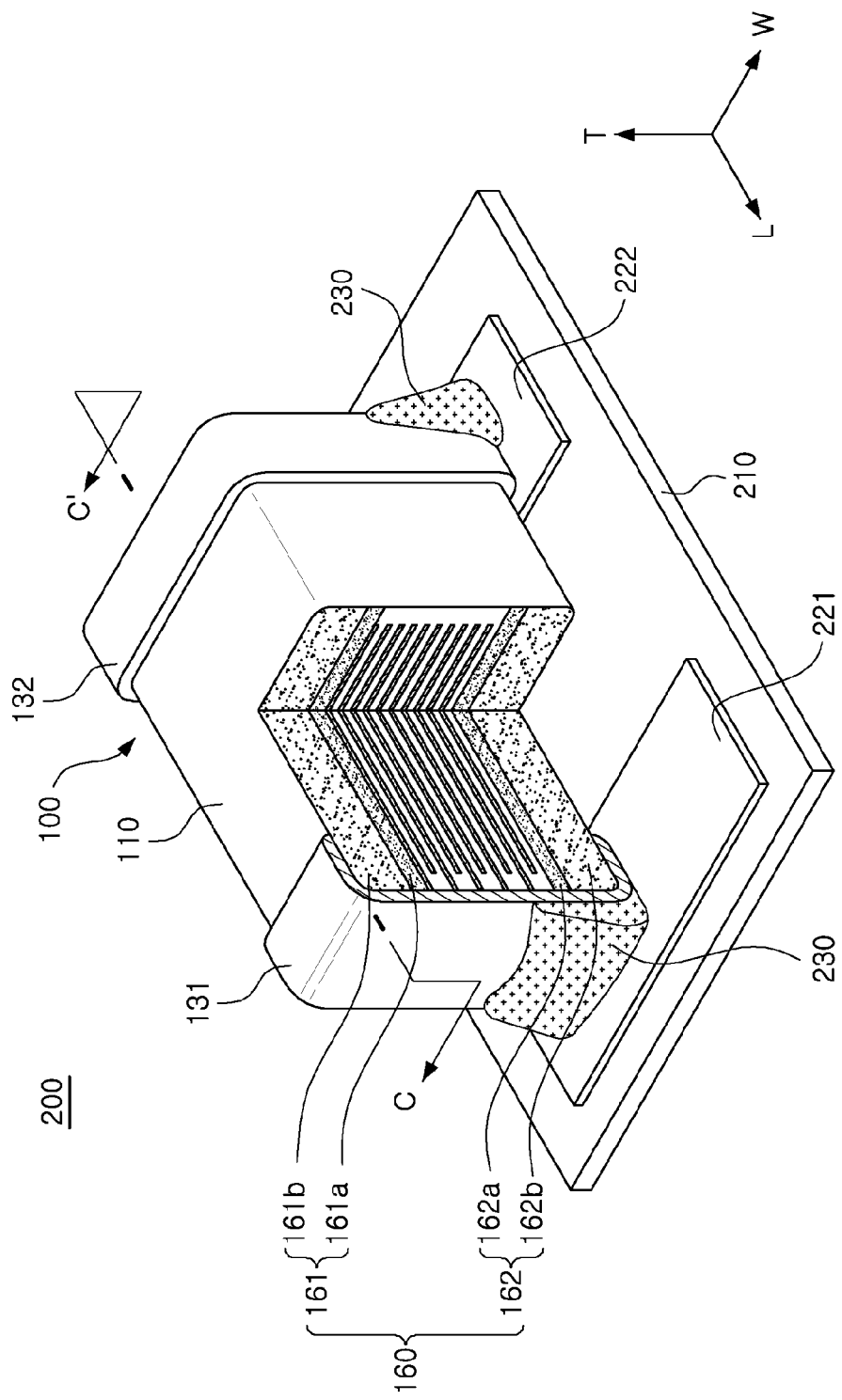
FIG. 9 is a partially cut-away perspective view schematically illustrating a board having a multilayer ceramic capacitor according to an exemplary embodiment of the present disclosure.
Figure 10:
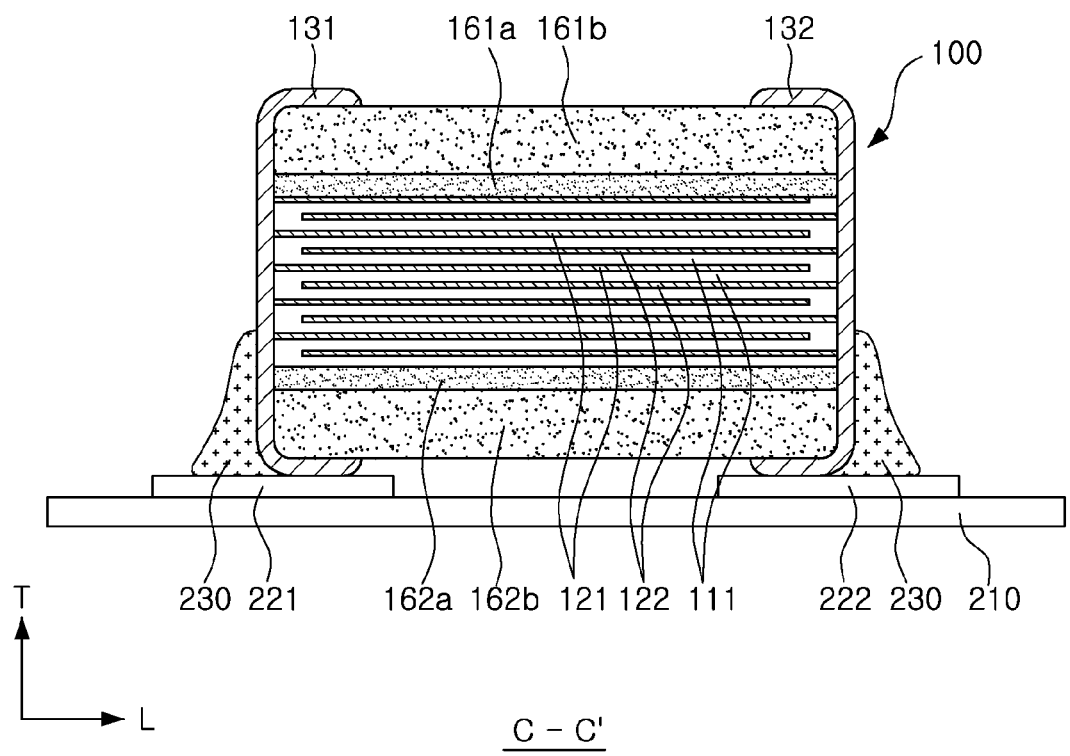
FIG. 10 is a cross-sectional view taken along line C-C' of FIG. 9.

FIG. 9 is a partially cut-away perspective view schematically illustrating a board having a multilayer ceramic capacitor according to an exemplary embodiment of the present disclosure; and FIG. 10 is a cross-sectional view taken along line C-C' of FIG. 9.

Referring to FIGS. 9 and 10, a board 200 having a multilayer ceramic capacitor according to the present exemplary embodiment may include the multilayer ceramic capacitor 100 and a printed circuit board 210 on which the multilayer ceramic capacitor 100 is mounted. The printed circuit board 210 may include electrode pads 221 and 222 formed on an upper surface of the printed circuit board 210.

Here, the multilayer ceramic capacitor 100 is the multilayer ceramic capacitor 100 according to the above-described exemplary embodiment of the present disclosure, so a detailed description thereof will be omitted in order to avoid redundancy.

The electrode pads may be first and second electrode pads 221 and 222 connected to the first and second external electrodes 131 and 132 of the multilayer ceramic capacitor 100, respectively.

Here, the first and second external electrodes 131 and 132 of the multilayer ceramic capacitor 100 may be electrically connected to the printed circuit board 210 by solders 230 in a state in which they are positioned to contact the first and second electrode pads 221 and 222, respectively.

Experimental Example

The following Table 1 shows data related to an amount of residual carbon within the exterior cover, a crack occurrence rate inside the ceramic body, and defects resulting from cracks appearing in the exterior of the ceramic body depending on a degree of porosity in the exterior cover.

The experiment detailed in the following Table 1 was performed using 1005-size multilayer ceramic capacitors having a length×width×thickness dimension of about 1.0 mm×0.5 mm×0.5 mm (error range: ±10%), each of which was manufactured to have substantially the same dimensions in terms of a thickness of an active part, a thickness of an active part protective cover, and a thickness of an exterior cover. In the Experimental Example, the thickness of the active part was about 0.25 mm, the thickness of the active part protective cover was about 0.003 mm, the thickness of the exterior cover was about 0.125 mm, and the active part protective cover and the exterior cover were disposed on both of upper and lower surfaces of the active part.

In Table 1, after the green sheet multilayer body for forming the ceramic body was plasticized at a temperature of about 650 C.° to 800 C.° for about four hours, an amount of residual carbon contained in the plasticized chip was measured. In Table 1, the crack occurrence rate inside the ceramic body was measured by counting the number of chips in which cracks occurred in the active part or the cover part among one hundred chips corresponding to each sample. In Table 1, the defects resulting from cracks appearing in the exterior of the ceramic body were determined by observing whether cracks had appeared in the exterior of the ceramic body after the ceramic body was polished. In the case in which a delamination region was present in the ceramic body or a portion of the ceramic body was separated from the ceramic body when being viewed from the exterior of the ceramic body, the cracks appearing in the exterior of the ceramic body resulted in the defects.

TABLE 1

| Sample | Porosity (vol %) in Exterior Cover | Amount (ppm) of Residual Carbon | Crack Occurrence Rate inside Ceramic Body | Defects Resulting from Cracks in Exterior of Ceramic Body |
| --- | --- | --- | --- | --- |
| 1* | 3 | 263 | 76/100 | X |
| 2* | 5 | 221 | 51/100 | X |
| 3* | 8 | 177 | 13/100 | X |
| 4 | 12 | 125 | 0/100 | X |
| 5 | 15 | 118 | 0/100 | X |
| 6 | 19 | 112 | 0/100 | X |
| 7 | 24 | 107 | 0/100 | X |
| 8 | 28 | 102 | 0/100 | X |
| 9 | 33 | 95 | 0/100 | X |
| 10 | 36 | 93 | 0/100 | X |
| 11 | 40 | 84 | 0/100 | X |
| 12 | 43 | 81 | 0/100 | X |
| 13* | 45 | 79 | 0/100 | ◯ |
| 14* | 49 | 74 | 0/100 | ◯ |
| 15* | 52 | 67 | 0/100 | ◯ |
| 16* | 55 | 60 | 0/100 | ◯ |

*indicates Comparative Examples
◯: Occurrence of Cracks in Exterior of Ceramic Body
X: Non-Occurrence of Cracks in Exterior of Ceramic Body Referring to Table 1, it can be seen that in Samples 1 to 3 in which porosity in the exterior cover was less than 12 vol %, residual carbon was not smoothly removed, such that the amount of residual carbon was relatively high, and the crack occurrence rate inside the ceramic body was relatively high due to the large amount of residual carbon. In addition, it can be seen that in Samples 13 to 16 in which porosity in the exterior cover exceeded 43 vol %, the crack occurrence rate inside the ceramic body was relatively low, while the cracks appearing in the exterior of the ceramic body resulted in defects after the ceramic body was polished due to a decrease in strength of the ceramic body.

As set forth above, according to exemplary embodiments of the present disclosure, a multilayer ceramic capacitor including a cover part having improved residual carbon removal efficiency, a method of manufacturing the same, and a board having the same may be provided.

While exemplary embodiments have been shown and described above, it will be apparent to those having ordinary skill in the art that modifications and variations could be made without departing from the spirit and scope of the present disclosure as embodied by the appended claims.

What is claimed is:

1. A multilayer ceramic capacitor, comprising:
an active part including dielectric layers and internal electrodes which are alternately stacked therein in a stacking direction; and
cover parts disposed on an upper surface and a lower surface of the active part, respectively,
wherein each of the cover parts includes an active part protective cover and an exterior cover, each of the active part protective covers being disposed adjacent to the active part and each of the exterior covers extending in the stacking direction to an external surface of the multilayer ceramic capacitor,
wherein a porosity of each of the exterior covers is higher than a porosity of each of the active part protective covers, respectively, and
wherein the porosity of at least one of the exterior covers is about 12 vol % to 43 vol %.

2. The multilayer ceramic capacitor of claim 1, wherein at least one of the cover parts is configured such that a removal rate of residual carbon in the exterior cover is faster than a removal rate of residual carbon in the active part protective cover.

3. The multilayer ceramic capacitor of claim 1, wherein the porosity of at least one of the active part protective covers is about 1 vol % or less.

4. The multilayer ceramic capacitor of claim 1, wherein at least one of the exterior covers is configured such that grains therein located closer to the active part protective cover have smaller diameters than grains therein located farther from the active part protective cover.

5. The multilayer ceramic capacitor of claim 1, wherein a thickness of at least one of the active part protective covers is about 0.5 μm to 100 μm.

6. The multilayer ceramic capacitor of claim 1, wherein a thickness of at least one of the cover parts is about ½ or more of a thickness of the active part.

7. A board having a multilayer ceramic capacitor, the board comprising:
a printed circuit board on which a plurality of electrode pads are disposed;
the multilayer ceramic capacitor of claim 1 mounted on the printed circuit board; and
solders connecting the plurality of electrode pads and the multilayer ceramic capacitor to each other.

8. A multilayer ceramic capacitor, comprising:
an active part including dielectric layers and internal electrodes which are alternately stacked therein; and
cover parts disposed on an upper surface and a lower surface of the active part, respectively, so as to be above and below, respectively, an outermost internal electrode,
wherein each of the cover parts includes an active part protective cover and an exterior cover, each of the active part protective covers being disposed adjacent to the active part, and
wherein an average diameter of grains contained in each of the exterior covers is larger than an average diameter of grains contained in each of the active part protective covers, respectively.

9. A multilayer ceramic capacitor, comprising:
an active part including dielectric layers and internal electrodes which are alternately stacked therein; and
a cover part disposed on at least one of an upper surface or a lower surface of the active part,
wherein the cover part includes an active part protective cover and an exterior cover, the active part protective cover being disposed adjacent to the active part, and
wherein the exterior cover contains metal particles formed by reducing a peroxidized metal.

10. A multilayer ceramic capacitor, comprising:
a ceramic body having an active part including a plurality of dielectric layers and first and second internal electrodes disposed to face each other with at least one of the plurality of dielectric layers interposed therebetween, the plurality of dielectric layers and the first and second internal electrodes are alternately stacked therein in a stacking direction, and cover parts disposed on an upper surface and a lower surface of the active part, respectively; and first and second external electrodes disposed on outer surfaces of the ceramic body to be connected to the first and second internal electrodes, respectively, wherein each of the cover parts includes an active part protective part and a thickness reinforcing part, each of the active part protective parts being disposed adjacent to the active part, and each of the thickness reinforcing parts being disposed on an exterior surface of the active part protective part so as to extend in the stacking direction to an external surface of the multilayer ceramic capacitor, wherein a porosity of at least one of the thickness reinforcing parts is higher than a porosity of the active part protective part, and wherein the porosity of at least one of the thickness reinforcing parts is about 12 vol % to 43 vol %.

11. The multilayer ceramic capacitor of claim 10, wherein a thickness of the ceramic body is T1 and a width of the ceramic body is W1, the ceramic body satisfies about $0.95 \leq W1/T1 \leq 1.05$.

12. The multilayer ceramic capacitor of claim 10, wherein an average size of grains contained in at least one of the thickness reinforcing parts is larger than an average size of grains contained in the active part protective part.

13. The multilayer ceramic capacitor of claim 10, wherein at least one of the thickness reinforcing parts is configured such that grains therein located closer to the active part protective part have smaller diameters than grains therein located farther from the active part protective part.

14. The multilayer ceramic capacitor of claim 10, wherein at least one of the thickness reinforcing parts contains metal particles formed by reducing a peroxidized metal.

15. A board having a multilayer ceramic capacitor, the board comprising:
a printed circuit board on which a plurality of electrode pads are disposed;
the multilayer ceramic capacitor of claim 10 mounted on the printed circuit board; and
solders connecting the plurality of electrode pads and the multilayer ceramic capacitor to each other.

16. A multilayer ceramic capacitor, comprising:
an active part including dielectric layers and internal electrodes which are alternately stacked therein in a stacking direction; and
cover parts disposed on an upper surface and a lower surface of the active part, respectively,
wherein each of the cover parts includes a first portion and a second portion having a different composition than the first portion, each of the first portions being located closer to the active part than the second portion,
wherein each of the second portions extends in the stacking direction to an external surface of the multilayer ceramic capacitor,
wherein a porosity of at least one of the second portions is higher than a porosity of the first portion, and
wherein the porosity of at least one of the second portions is about 12 vol % to 43 vol %.

17. The multilayer ceramic capacitor of claim 16, wherein the different composition includes different materials.

18. The multilayer ceramic capacitor of claim 16, wherein the different composition includes different average diameter of grains, an average diameter of grains contained in at least one of the second portions is larger than an average diameter of grains contained in the first portion.

19. The multilayer ceramic capacitor of claim 16, wherein at least one of the cover parts is composed of at least one dielectric layer.

20. The multilayer ceramic capacitor of claim 19, wherein at least one of the second portions contains metal particles.

21. The multilayer ceramic capacitor of claim 16, further comprising an external electrode connected to the internal electrodes.

22. The multilayer ceramic capacitor of claim 21, wherein the external electrode is disposed on a side surface of the active part and a side surface of at least one of the cover parts.

* * * * *